United States Patent
Ku

(10) Patent No.: US 7,467,020 B2
(45) Date of Patent: Dec. 16, 2008

(54) METHOD FOR GRADUALLY ADJUSTING THE VOLUME LEVEL OF A DIGITAL SIGNAL WITHIN A PREDEFINED TIME USING A VOLUME CONTROL CIRCUIT

(75) Inventor: Po-Wen Ku, Hsin-Chu Hsien (TW)

(73) Assignee: Media Tek Inc., Hsin-Chu Hsien (TW)

( * ) Notice: Subject to any disclaimer, the term of this patent is extended or adjusted under 35 U.S.C. 154(b) by 778 days.

(21) Appl. No.: 10/605,790

(22) Filed: Oct. 27, 2003

(65) Prior Publication Data

US 2005/0090917 A1    Apr. 28, 2005

(51) Int. Cl.
*G06F 17/00* (2006.01)
*H03G 3/00* (2006.01)

(52) U.S. Cl. .................. 700/94; 381/104; 381/107

(58) Field of Classification Search ......... 381/104–109, 381/94.1–94.9; 700/94
See application file for complete search history.

(56) References Cited

U.S. PATENT DOCUMENTS

| | | | |
|---|---|---|---|
| 4,550,425 A * | 10/1985 | Andersen et al. ............ 704/212 |
| 4,726,067 A * | 2/1988 | Alonso ........................ 381/106 |
| 6,535,611 B1 * | 3/2003 | Lau ............................. 381/104 |
| 6,868,162 B1 * | 3/2005 | Jubien et al. ................ 381/107 |

OTHER PUBLICATIONS http://www.misticriver.net/archive/index.php/t-36224.html.*

* cited by examiner

*Primary Examiner*—Suhan Ni
*Assistant Examiner*—Andrew C Flanders
(74) *Attorney, Agent, or Firm*—Winston Hsu

(57) ABSTRACT

According to the claimed invention, a DSP is disclosed. The DSP comprises a processing unit for processing the data stream, a first memory coupled to the processing unit for storing a destination volume value, and a second memory coupled to the processing unit for storing a time_determining value wherein the processing unit adjusts the volume of the signal stored in the data stream according to the time_determining value such that the adjustment from a current volume value of the signal to the destination volume value is accomplished within a predetermined time.

14 Claims, 2 Drawing Sheets

US 7,467,020 B2

METHOD FOR GRADUALLY ADJUSTING THE VOLUME LEVEL OF A DIGITAL SIGNAL WITHIN A PREDEFINED TIME USING A VOLUME CONTROL CIRCUIT

BACKGROUND OF INVENTION

1. Field of the Invention

The invention relates to a volume control method and circuit, and more particularly, to a volume control method and circuit that gradually changes the volume of a signal so as to reduce or eliminate associated noise.

2. Description of the Prior Art

Nearly all audio devices have a volume control located on the user interface. The earliest method to control volume was to instantaneously change the current volume to the destination volume. This method works well for case where the volume difference is nominal. However, in cases where the difference is significant, audio noise is introduced into the volume change, namely in the form of a "popping" noise.

Another method of volume control is given by U.S. Pat. No. 6,535,611 Lau. Instead of instantly changing the volume, U.S. Pat. No. 6,535,611 Lau reaches the destination volume by gradually changing the current volume by a defined incremental value or "volume step" and then passing a certain number of samples wherein a sample corresponds to a certain amount of time. Assume the following for the example: current volume=10, destination volume=20, volume step=2, and sample number=5. The method will check if there is a volume difference present, and if there is, the current volume will be incremented by 2. Afterwards, the method passes 5 samples. Then the process starts again with the method checking if a volume difference is present. As one can see, the method takes 5 increments or volume steps and passes 25 samples to reach the volume destination.

A consequence of this method is that the amount of time it takes to reach the final destination is dependent upon how large the volume difference is. A smaller volume difference results in less samples having to be passed which in turn results in less time used. A larger volume difference results in more samples having to be passed which in turn results in more time used. If the above example had a volume difference of 6, then it would take 3 increments or 15 samples being passed to accomplish the change. If the above example had a volume difference of 20, then it would take 10 increments or 50 samples being passed to accomplish the change.

In addition, the time length of one sample is different for each kind of source material. For example, because the resolution of a CD is smaller than that of a DVD, a sample on a CD is longer than a sample on a DVD. Consequently, a volume change that requires that passing of 25 samples would take longer for CD than a DVD.

Clearly, the methods presented by the prior art have their distinctive drawbacks. Instantaneous change in volume results in an undesirable "popping" noise while gradually changing the volume with a defined incremental value leads to variable times in reaching the final destination for different volume differences.

SUMMARY OF INVENTION

It is therefore a primary objective of the claimed invention to provide a Digital Signal Processor DSP and a related method for adjusting an audio signal to a destination volume within a predetermined time period to solve the above-mentioned problem.

According to the claimed invention, a DSP is disclosed. The DSP comprises a processing unit for processing a data stream, a first memory coupled to the processing unit for storing a destination volume value, and a second memory coupled to the processing unit for storing a time_determining value wherein the processing unit adjusts the volume of the signal stored in the data stream according to the time_determining value such that the adjustment from a current volume value of the signal to the destination volume value is accomplished within a predetermined time.

It is advantageous to employ a time_determining value to gradually adjust the volume. By using a time_determining value, all volume changes, regardless of the difference of the volume change, will take the same amount of time to accomplish. Thus, the user will be able to adjust the volume without the accompanying "popping" noise in a predictable time frame.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
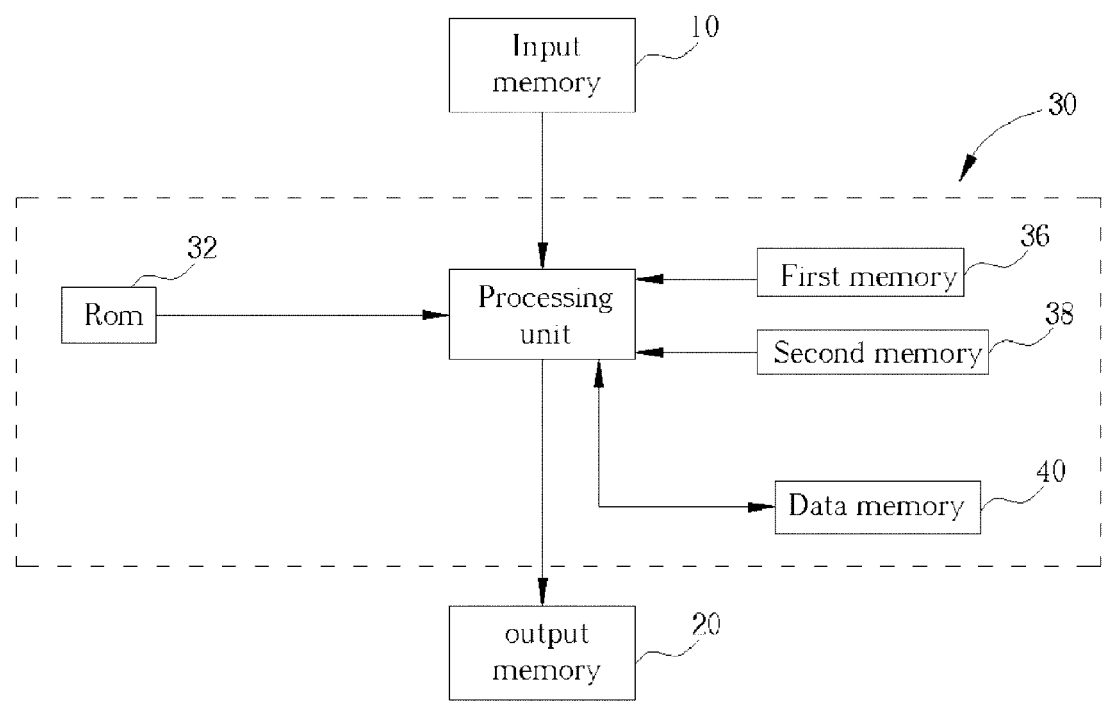
FIG. 1 is a diagram of a DSP according to the present invention.

Please refer to FIG. 1. FIG. 1 is a diagram of a DSP 30 according to the present invention. In this preferred embodiment of the present invention, the DSP 30 comprises a Read Only Memory (ROM) 32, a processing unit 34, a first memory 36, a second memory 38, and a data memory 40. The ROM 32 stores a program to control the flow of operations in the processing unit 32. The processing unit 32 executes passed instructions. The first memory 36 stores a destination volume value while the second memory 38 stores a time_determining value. Finally, the data memory 40 stores temporary variables resulting from operations executed by the processing unit 34.

The DSP 30 receives a data stream from an input memory 10. The DSP 30 then processes the data stream in a variety of ways. The one of concern in the present invention is gradually adjusting the volume within a predefined time by the DSP 30 according to the following steps before outputting the stream to an output memory 20.

Figure 2:
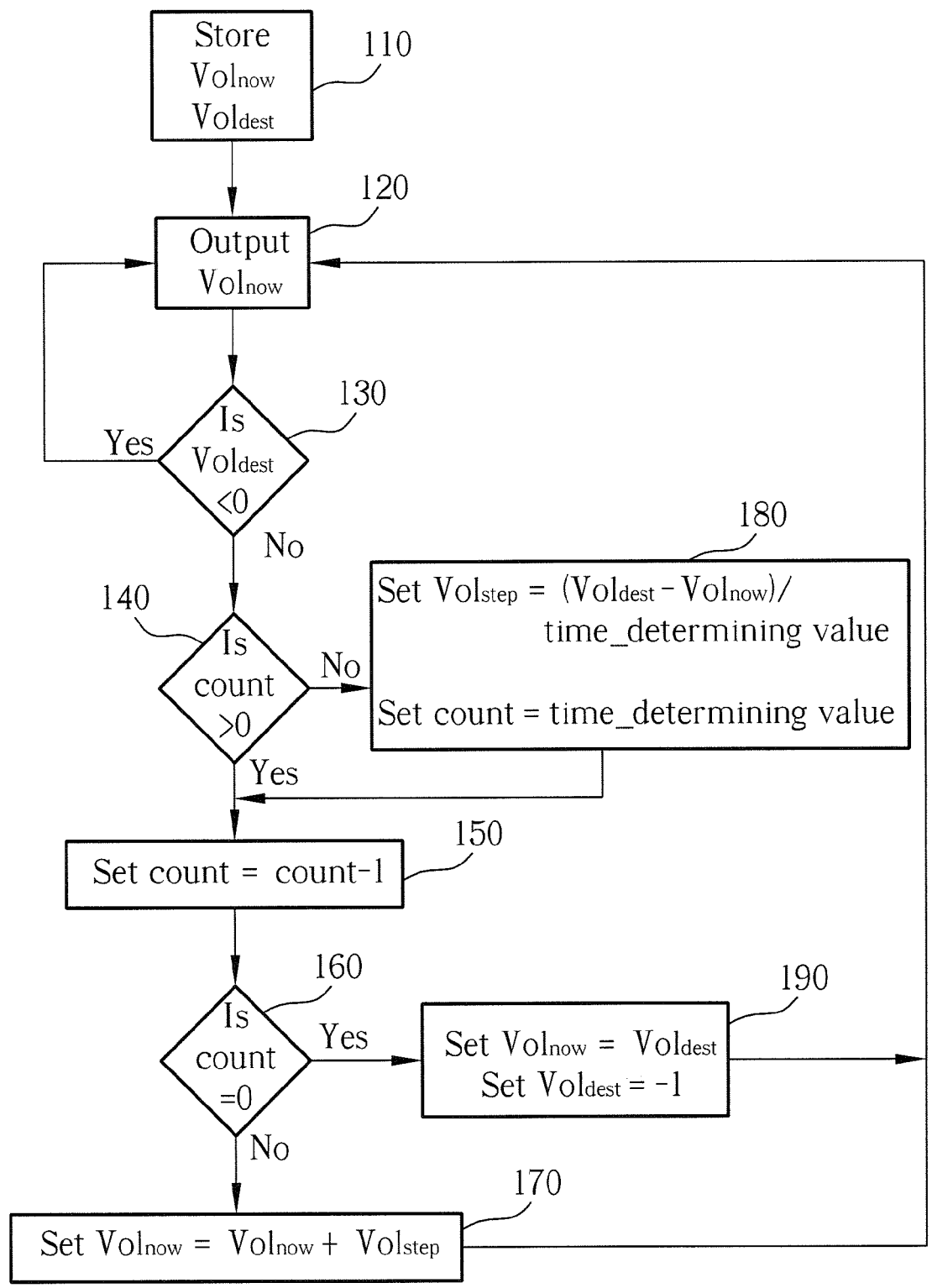
FIG. 2 is a flowchart of the operations used by the DSP according to the present invention.

Please refer to FIG. 2. The flowchart in FIG. 2 assumes a number of things. First of all, a positive range of volume is assumed i.e. the volume range is 0 40 with 0 being no volume and 40 being the loudest volume. In the case where a negative volume range is used, the signs involving the destination volume, the current volume, and the volume step would be opposite of the positive volume range (an example of a negative volume range would have 0 being the loudest volume and some negative number like 40 as no volume). The flowchart assumes that all variables have an initial value of zero. Also, the flowchart of the preferred embodiment of the invention employs the use of a variable named count not previously mentioned. The variable count is assigned the value of the time_determining variable. The variable count is also used as a control step in the flowchart to determine when to calculate the volume step. The following is a flowchart of the operations of the DSP 30:

Step 110: Retrieve the destination volume from the first memory 36 and the current volume from the data stream. The destination volume is determined by the user through an audio devices interface. For example, a stereo has a knob that the user turns to indicate the desired destination volume. Store the destination volume ($Vol_{dest}$) and the current volume ($Vol_{now}$) in data memory 40.

Step 120: Output $Vol_{now}$ to the output memory 40 for listening by the user.

Step 130: Check if $Vol_{dest}$ is less than 0. If $Vol_{dest}$ is greater than zero, this indicates that the volume has not reached the destination volume. As a result, proceed to Step 130.

If the $Vol_{dest}$ is less than zero, this indicates the destination volume has been reached so return to Step 120.

Step 140: Check if the variable count is greater than 0. Remember comparing the variable count is a control step. The first time through this method, the variable count should have been initialized to 0.

If the variable count is greater than 0 that means that the variable count has already been assigned the value of the time_determining value and the volume step size has been determined. As a result, proceed to Step 150.

If the variable count is not greater than 0, this indicates that this is the first time through the volume adjusting process and that the volume step size needs to be determined along with assigning the variable count the time_determining value, all of which is done in Step 180. In this way, having a variable count helps control the flow of the steps.

Step 150: Decrement the variable count by 1. By decrementing the variable count, we control the amount of time the spent on adjusting the volume. This is due to the fact that the first time through the steps, the variable count is assigned the same value as the time_determining value in Step 180. Please note that the variable count does not necessarily have to be decremented by 1.

Step 160: Check if the variable count is equal to 0. If the variable count is 0, then go to Step 190. When the variable count is equal to zero, this means that it is safe to raise the current volume level directly to the destination volume. In other words, when count is 0, only one volume step remains, and this last volume step will adjust the current volume to the destination volume. This is done because sometimes the volume step is not a whole number but a repeating decimal. As a result, the current volume can never reach the destination volume by simply adding this kind of volume step, so the last step raises the volume to the destination volume instead of using the volume step.

If the variable count is not 0, go to step 170. If the variable count is not 0, this means that more than one value step needs to be added to the current volume.

Step 170: Set $Vol_{now}$ equal to the sum of $Vol_{now}$ and $Vol_{step}$. In this step, the current volume is gradually being adjusted. Then go to Step 120.

Step 180: This step is only done once. It serves to create and determine the size of a volume step variable ($Vol_{step}$). First, retrieve the time_determining value from the second memory 36. Remember the time_determining step can be input by the user via a control panel on the audio device such as a knob on a stereo. Set $Vol_{step}$ equal to the difference between $Vol_{dest}$ and $Vol_{now}$ divided by the retrieved time_determining value. In this way, the size of the volume step is varied according to the size of the volume difference. Also, set the variable count equal to the time_determining value and then use the variable count throughout the rest of the steps to control the amount of time it takes to reach the volume destination. Go to Step 150.

Step 190: The current volume is now close enough to the destination value that one can directly set $Vol_{now}$ equal to the $Vol_{dest}$. Then to indicate that the volume change has been accomplished, $Vol_{dest}$ is set to 1. Go to Step 120.

In other words, the DSP 30 receives a data stream from the input memory 10. Executing the instructions provided by the ROM 32, the DSP 30 is able to adjust the volume in a gradual fashion within a predetermined time. The key that allows the DSP 30 to reach the destination volume within a predetermined time lies in the time_determining value stored within the second memory 40. By dividing the volume difference by the time_determining value, the volume step can be made variable. That is the size of the increment (or decrement in the case where the destination volume is less than the current volume) changes in response to the size of the volume difference so that all volume changes take the same amount of time as given by the time_determining value. Therefore, for a given time period, a larger volume difference would take larger volume steps while a smaller volume difference would take smaller volume steps for the same time period. The end result is a volume change of 5 and a volume change of 50 would both take the same amount of time.

Please note that the time_determining value can be user selectable. In addition, the time_determining value does not necessarily have to be in the form of time. In the preferred embodiment, a sample number value is used as the time_determining value. That is the DSP 30 will reach the destination volume within the time it takes to pass a certain number of samples as defined by the sample number value. As previously mentioned, passing a sample corresponds to a certain amount of time, so the original goal of accomplishing any volume change within a given time is still left intact by using a sample number value for the time_determining value.

If one were to use a sample number value as the time_determining value, please bear in mind that different source materials have different resolutions e.g. CD and DVD. As a result, a sample length for a CD is not the same time length as a sample length for a DVD. In this case, the DSP 30 can employ a plurality of second memories 38 to enable the same volume change across different source materials to take the same amount of time (i.e. in order to make a volume change of 10 on a CD take the same amount of time as a volume change of 10 on a DVD). Each second memory 38 can store a sample number value for a different source material with all the stored sample numbers being equivalent. For example, one second memory 38 can store a sample number value for a CD while another second memory 38 can store a sample number value for a DVD, and the two stored sample number values correspond to the same time length.

To place things in perspective with the prior art, please take the following example. Assume the current volume=10, volume step=2, and sample number=1. In the prior art U.S. Pat. No. 6,535,611 Lau, if one wanted to reach a destination volume of 20, then it would the device would pass 5 samples; if one wanted to reach 30, then it would pass 10 samples; and if one wanted to reach 50, then it would pass 20 samples. The volume is always changed by a volume step of 2 with each pass of a sample. Thus, there is no control over time.

However, with the present invention, the user is allowed to select the number of samples to be passed, so if the user selects 5, then all volume changes will be done in 5 passed samples. For the first case, reaching a destination volume of 20, the volume step would be 2 since the volume difference 10 divided by the sample number 5 is equal to 2. In the second case, reaching a destination volume of 30, the volume step would be 4 since the volume difference 20 divided by the sample number 5 is equal to 4. In the third case, reaching a destination volume of 40, the volume step would be 8 since the volume difference 40 divided by the sample number 5 is equal to 8. Please remember that passing samples is only the preferred embodiment. In reality any kind of time_determining value can be used e.g. time.

Also remember that the same volume difference from different source materials can be accomplished in the same time period; something that the prior art U.S. Pat. No. 6,535,611 Lau cannot do. For example, imagine that a volume change of 10 needs to be done. Using the settings of current volume=10, volume step=2, and sample number=63 for the prior art, it would take 315 samples to reach the destination volume. Passing 315 samples on a DVD takes a shorter amount of time that passing 315 samples on a CD.

Now the present invention can employ a second memory for each source material i.e. one for DVD and one for CD and select the appropriate sample number. For example, assume a user wants to have all volume changes, regardless of source material, to be accomplished in the time it takes to pass 315 CD samples. The user can input this into the device. The DSP in turn stores a value of 315 into the second memory designated for the CD sample number. The DSP can then convert the CD sample value of 315 into a DVD sample value of 320 and store the DVD value into the other second memory. In this way, the volume change for a CD takes the same amount of time as a volume change for a DVD.

In contrast to the prior art, the present invention can accomplish any volume change with minimal noise in the same amount of time by varying the size of the volume step so that the user can experience predictable equipment behavior.

Those skilled in the art will readily observe that numerous modifications and alterations of the device may be made while retaining the teachings of the invention. Accordingly, that above disclosure should be construed as limited only by the metes and bounds of the appended claims.

What is claimed is:

1. A method of changing the audible volume level of a digital signal comprising:
   providing a destination volume value to a DSP; and
   with the DSP, gradually incrementing the volume level of the digital signal by a volume level increment to the destination volume within a predetermined time period;
   whereby any destination volume is achieved in the digital signal in the same amount of time and a size of the volume level increment is determined as the destination volume minus the volume level of the digital signal divided by the predetermined time period.

2. The method of claim 1 wherein the incrementing step further comprises:
   gradually incrementing the digital signal within a predetermined sample number corresponding to the predetermined time period.

3. The method of claim 2 wherein the incrementing step further comprises:
   subtracting the current volume value of the digital signal from the destination volume;
   dividing the result from the subtracting step by the predetermined sample number to obtain a volume step;
   incrementing the output signal by the volume step in a continuous fashion until the volume destination is reached.

4. The method of claim 3 wherein the result from the subtracting step is a positive number.

5. The method of claim 3 wherein the result from the subtracting step is a negative number.

6. The method of claim 2 wherein the predetermined sample number is user-selectable.

7. A Digital Signal Processor (DSP) for adjusting the volume of a digital signal stored in a data stream, the DSP comprising:
   a processing unit for processing the data stream; a first memory coupled to the processing unit for storing a destination volume value; and
   a second memory coupled to the processing unit for storing a time_determining value;
   wherein the processing unit gradually increments a volume level of the digital signal by a volume level increment to the destination volume value within a predetermined time period, any destination volume value is achieved in the digital signal in the same amount of time, and a size of the volume level increment is determined as the destination volume value minus the volume level of the digital signal divided by the predetermined time period.

8. The DSP in claim 7 further comprising a program memory coupled to the processing unit for storing a program controlling the flow of operations in the DSP.

9. The DSP in claim 8 wherein the program memory comprises a ROM type memory.

10. The DSP in claim 7 wherein the first memory comprises a register.

11. The DSP in claim 7 wherein the second memory comprises a register.

12. The DSP in claim 7 further comprising a data memory for storing temporary variables.

13. The DSP in claim 12 wherein the data memory comprises an SRAM type memory.

14. The DSP in claim 7 wherein the second memory stores a sample number corresponding to the predetermined time.

* * * * *